United States Patent
Preikszas et al.

(10) Patent No.: US 11,139,140 B2
(45) Date of Patent: Oct. 5, 2021

(54) PARTICLE BEAM APPARATUS HAVING AN APERTURE UNIT AND METHOD FOR SETTING A BEAM CURRENT IN A PARTICLE BEAM APPARATUS

(75) Inventors: Dirk Preikszas, Oberkochen (DE); Michael Albiez, Aalen (DE)

(73) Assignee: Carl Zeiss Microscopy GmbH, Jena (DE)

(*) Notice: Subject to any disclaimer, the term of this patent is extended or adjusted under 35 U.S.C. 154(b) by 821 days.

(21) Appl. No.: 12/804,507

(22) Filed: Jul. 22, 2010

(65) Prior Publication Data

US 2011/0049361 A1 Mar. 3, 2011

(30) Foreign Application Priority Data

Jul. 24, 2009 (DE) ..................... 10 2009 028 013.8

(51) Int. Cl.
| | |
|---|---|
| H01J 37/09 | (2006.01) |
| H01J 37/141 | (2006.01) |
| H01J 37/15 | (2006.01) |
| H01J 37/28 | (2006.01) |
| H01J 37/26 | (2006.01) |

(52) U.S. Cl.
CPC .............. *H01J 37/09* (2013.01); *H01J 37/15* (2013.01); *H01J 37/265* (2013.01); *H01J 37/28* (2013.01); *H01J 2237/0455* (2013.01); *H01J 2237/0492* (2013.01); *H01J 2237/14* (2013.01); *H01J 2237/2002* (2013.01); *H01J 2237/26* (2013.01); *H01J 2237/31749* (2013.01)

(58) Field of Classification Search
CPC .......... H01J 37/09; H01J 37/10; H01J 37/141; H01J 37/1413; H01J 37/15; H01J 2237/0455; H01J 2237/0492; H01J 2237/94922

USPC ................................ 250/396 ML, 306–443.1
See application file for complete search history.

(56) References Cited

U.S. PATENT DOCUMENTS

| | | | | |
|---|---|---|---|---|
| 2,679,018 A | * | 5/1954 | Reisner ................ | H01J 37/141 |
| | | | | 250/396 ML |
| 2,852,684 A | | 12/1955 | Payne | |

(Continued)

FOREIGN PATENT DOCUMENTS

| | | |
|---|---|---|
| DE | 1 498 542 | 4/1964 |
| DE | 1 614 122 | 2/1967 |

(Continued)

OTHER PUBLICATIONS

Carl Zeiss, "Merlin Analytical Power for the Sub-Nanometer World", 9 Pages, Jun. 2009.

*Primary Examiner* — Eliza W Osenbaugh-Stewart
(74) *Attorney, Agent, or Firm* — Muirhead and Saturnelli, LLC

(57) ABSTRACT

A particle beam apparatus includes a first aperture unit having an adjustable aperture opening. The particle beam apparatus may include a first condenser lens having a first pole shoe and a second pole shoe. Both the first pole shoe and the second pole shoe may be adjustable relative to a second aperture unit independently of each other. The second aperture unit may be designed as a pressure stage aperture separating a first area having a vacuum at a first pressure, and a second area having a vacuum at a second pressure. Additionally, a method for adjusting a beam current in a particle beam apparatus is provided.

30 Claims, 10 Drawing Sheets

(56) References Cited

U.S. PATENT DOCUMENTS

| | | | |
|---|---|---|---|
| 2,749,464 A * | 6/1956 | Le Poole | 313/443 |
| 2,993,993 A | 7/1961 | Delong et al. | |
| 3,526,766 A | 9/1970 | Riecke | |
| 3,560,781 A | 2/1971 | Riecke | |
| 3,588,586 A | 6/1971 | Yanaka | |
| 3,610,734 A | 10/1971 | Wollnik | |
| 3,979,590 A | 9/1976 | Andersen | |
| 4,588,891 A | 5/1986 | Saito | |
| 4,626,689 A | 12/1986 | Tomita et al. | |
| 4,714,833 A | 12/1987 | Rose et al. | |
| 5,065,034 A | 11/1991 | Kawanami et al. | |
| 5,387,793 A | 2/1995 | Sato et al. | |
| 5,582,590 A * | 12/1996 | Hauser et al. | 604/30 |
| 5,721,432 A | 2/1998 | Satoh et al. | |
| 5,866,904 A | 2/1999 | Todokoro et al. | |
| 6,025,593 A | 2/2000 | Suzuki et al. | |
| 6,040,576 A | 3/2000 | Benner | |
| 6,448,667 B2 * | 9/2002 | Godel et al. | 290/1 R |
| 6,657,211 B2 | 12/2003 | Benner | |
| 6,753,533 B2 | 6/2004 | Mita | |
| 6,946,654 B2 * | 9/2005 | Gerlach et al. | 850/3 |
| 7,550,724 B2 * | 6/2009 | Ichimura et al. | 250/310 |
| 2002/0166600 A1 * | 11/2002 | Verclyte | 139/222 |
| 2007/0042144 A1 * | 2/2007 | Teensma et al. | 428/34.2 |
| 2007/0057185 A1 | 3/2007 | Ichimura et al. | |
| 2007/0085003 A1 * | 4/2007 | Miyazaki et al. | 250/310 |
| 2007/0138403 A1 * | 6/2007 | Cubric et al. | 250/396 ML |
| 2007/0200069 A1 | 8/2007 | Frosien et al. | |
| 2007/0257207 A1 | 11/2007 | Frosien et al. | |
| 2008/0135786 A1 | 6/2008 | Lanio et al. | |
| 2008/0149831 A1 | 6/2008 | Saito | |
| 2008/0185519 A1 * | 8/2008 | Takahashi et al. | 250/311 |
| 2008/0230694 A1 * | 9/2008 | Frosien | H01J 37/12 250/307 |
| 2008/0308731 A1 * | 12/2008 | Nishiyama et al. | 250/310 |
| 2010/0038538 A1 | 2/2010 | Drexel | |

FOREIGN PATENT DOCUMENTS

| | | |
|---|---|---|
| DE | 10 2007 010 873 A1 | 9/2008 |
| EP | 0 280 375 A1 | 8/1988 |
| EP | 0 390 118 B1 | 2/1997 |
| EP | 0 899 771 A2 | 3/1999 |
| EP | 1 172 837 A2 | 1/2002 |
| EP | 1 760 762 A1 | 3/2007 |
| GB | 1049561 | 11/1966 |
| JP | S57-67912 A | 4/1982 |
| JP | 59-221953 | 12/1984 |
| JP | 59-221953 A | 12/1984 |
| JP | 61-076673 A | 4/1986 |
| JP | 61-76673 | 5/1986 |
| JP | 61-76673 U | 5/1986 |
| JP | S63-226864 A | 9/1988 |
| JP | H01-189844 A | 7/1989 |
| JP | H05-325854 | 12/1993 |
| JP | H08-255589 A | 10/1996 |
| JP | 11-86767 | 3/1999 |
| JP | 11086767 | 3/1999 |
| JP | 2006-156215 A | 6/2006 |
| JP | 2007-80667 A | 3/2007 |
| JP | 2007-504606 A | 3/2007 |
| JP | 2008-153158 A | 7/2008 |
| JP | 2008-204675 A | 9/2008 |

* cited by examiner

PARTICLE BEAM APPARATUS HAVING AN APERTURE UNIT AND METHOD FOR SETTING A BEAM CURRENT IN A PARTICLE BEAM APPARATUS

TECHNICAL FIELD

This application relates to a particle beam apparatus having an aperture unit. In addition, this application relates to an aperture unit for a particle beam apparatus. Further, this application relates to a method for setting a beam current in a particle beam apparatus. Reference herein to a particle beam apparatus may include an electron-beam device, in particular a scanning electron microscope (henceforth also referred to as an SEM) and a transmission electron microscope (henceforth also referred to as a TEM), as well as an ion-beam device. Consequently, the system described herein is not limited to electron beam devices. It may be usable on any particle beam apparatus.

BACKGROUND OF THE INVENTION

Electron beam devices, in particular SEMs, are used to analyze surfaces of objects (samples). For this purpose, an electron beam (henceforth also referred to as a primary electron beam) is generated in an SEM using a beam generator and focused through an objective lens on the object to be analyzed. Using a deflection device, the primary electron beam is guided over the surface of the object to be analyzed in a grid pattern. In this process, the electrons of the primary electron beam begin to interact with the object. As a consequence of this interaction, interacting particles and/or interacting radiation are generated, which are detected. The resulting detection signals are evaluated.

Interacting particles include, in particular, electrons emitted from the object surface (so-called secondary electrons) or electrons scattered back from the primary electron beam (so-called backscattered electrons). The secondary electrons and the backscattered electrons are detected via at least one detector of the electron beam device. The resulting detector signal is used to generate an image.

As a rule, the generation of high-resolution images is of interest. To achieve this, the electron beam device is operated in the so-called high resolution mode. In the case of the electron beam device, the beam generator generates a primary electron beam having a predefinable beam current in a range between approximately 1 µA and 100 µA, for example, 20 µA. The primary electron beam is essentially guided along an optical axis of the electron beam device towards a sample to be analyzed. Inside the electron beam device, a first aperture is situated which reduces the beam current of the primary electron beam to approximately 1 nA to 100 nA, for example, 20 nA. A second aperture, which is located downstream from the first aperture in the direction of the sample, reduces the beam current again, namely to values of a few pA to approximately 500 pA, for example, in the range between 1 pA and 200 pA. The described reduction of the beam current results in the interactions of the residual electrons in the primary electron beam among each other remaining negligibly small, so the resulting primary electron beam dispersion may be prevented. This advantageously provides for high-resolution image generation.

In addition to the high-resolution image generation mentioned above, there are additional analysis methods that may be used with an electron beam device for analyzing an object to be analyzed. This includes, in particular, the so-called EBSD method (Electron Backscattered Diffraction), wherein diffraction patterns of electrons are determined which are scattered back from the object after the primary electron beam has impinged upon the object to be analyzed. An additional analysis method is based on detection of cathodoluminescence light emitted from an object when the primary electron beam has impinged upon the object. Additional analysis methods include, for example, analysis of energy-dispersive X-ray spectroscopy (EDX) and analysis of wavelength-dispersive X-ray spectroscopy (WDX). For the above analysis methods it is, however, desirable to operate the electron beam apparatus in high-current mode. This means that the primary electron beam impinges upon the object to be analyzed with a beam current in the range of several nA, for example, of between 100 nA and 500 nA. This results in better count rates in the above analysis methods, which is advantageous for evaluation of these methods.

Consequently, there is a need to be able to vary the beam current of a particle beam, in particular of an electron beam, in order to be able to set the appropriate beam current for the desired mode of the particle beam apparatus (high resolution mode or high current mode). In high resolution mode, this should allow achieving good image resolution when generating images, such as in a range between 0.5 nm and 3.0 nm, depending on the energy of the primary electron beam.

From the prior art it is also known that an electron beam apparatus may be provided with one or several pressure stages separating areas of the electron beam apparatus, each having a vacuum at a different pressure. So, for example, a pressure stage separates a first area in which a beam generator is situated and that generally has ultra-high vacuum ($10^{-6}$ to $10^{-10}$ Pa) from a second area having high vacuum ($10^{-1}$ to $10^{-5}$ Pa). The second area may, for example, be a sample chamber of the electron beam apparatus, in which a sample is situated, or an intermediate pressure area leading to the sample chamber. In some electron beam devices it is provided for the pressure stages to simultaneously be designed as apertures. The pressure stages prevent the ultra-high vacuum of the first area from being degraded by contaminants from the second area, for example, due to gases being introduced in the area of the sample.

An electron beam apparatus is known from the prior art that allows setting the beam current for a desired operating mode. This known electron beam apparatus has an electron beam generator and an objective lens for focusing a primary electron beam on an object to be analyzed. In addition, the known electron beam apparatus has a first condenser lens and a second condenser lens, with the design being such that—as seen from the electron beam generator toward the objective lens—the second condenser lens follows the first condenser lens. In addition, a first aperture unit is provided, which is situated between the electron beam generator and the first condenser lens. Further, a second aperture unit is provided, which is situated between the first condenser lens and the second condenser lens. The second aperture unit is designed as a pressure stage aperture. The first aperture unit has several different aperture openings. The beam current is set by shifting the first aperture unit in a plane perpendicular to the optical axis and by guiding the desired aperture opening under the primary electron beam. The known electron beam apparatus shall also allow preventing contaminations of the second aperture unit, which is designed as a pressure stage aperture. These contaminations result from the primary electron beam impinging upon the pressure stage aperture.

The prior art does, however, have the disadvantage that, for certain excitations of the first condenser lens, the primary electron beam will not pass through the second aperture unit. The beam path of the primary electron beam is not mode-independent (with the mode describing the primary energy and the beam current selected). This case is also called "straying" of the primary electron beam. Consequently, it is desirable to attain a primary electron beam path that is as mode-independent as possible.

In addition, a particle beam apparatus is known from the prior art which has an aperture unit including a first aperture element and a second aperture element. Both the first aperture element and the second aperture element each have a V-shaped notch that cooperates to form an aperture opening. The first aperture element and the second aperture element overlap and are movable in opposite directions. This allows setting the size of the aperture opening, and thus also of the beam current of a particle beam from the particle beam apparatus.

With regard to the prior art mentioned above, reference is made to U.S. Pat. No. 7,550,724 B2 and US 2007/0138403 A1, which are incorporated herein by reference.

The two aperture units known from the prior art have a disadvantage. They are moved by a manipulator either mechanically using a manual pivot lever, or by an actuator motor for setting the aperture opening Due to unavoidable imprecisions of the manipulator's mechanical components, the positions that have to be set for the individual aperture units in order to attain a certain aperture opening in the beam path of the particle beam are usually not reproducible. So, in order to obtain the desired beam current, the aperture unit needs to be readjusted. This is generally performed by moving the aperture unit with the aid of the manipulator while observing the beam current.

Even if the manipulator is operated by piezoelectric elements, the aperture unit position for attaining a certain beam current cannot be set sufficiently well. A setting with the aid of piezoelectric elements is also prone to faults that may, for example, result from hysteresis. Consequently, when a piezoelectric element is used for actuating the manipulator, a complex measuring system must be used for determining the paths travelled by the manipulator in order to be able to position the desired aperture opening of the aperture unit precisely under the particle stream.

Accordingly, it would be desirable to provide an aperture unit and a particle beam apparatus having an aperture unit that allow setting the beam current of a particle stream sufficiently well and with little effort, as well as attaining a beam path of the particle beam that is as mode-independent as possible. In addition, it would be desirable to provide a method that allows attaining good resolution when generating images.

SUMMARY OF THE INVENTION

According to the system described herein, a particle beam apparatus may have a particle beam generator that generates particles. The particles form a particle beam. In addition, an objective lens for focusing the particle beam on a sample may be provided. In addition, the particle beam apparatus may have a first condenser lens and a second condenser lens. As viewed from the particle beam generator toward the objective lens, the first condenser lens may be situated first in the particle beam apparatus, and then the second condenser lens. In other words, the above-mentioned components may be situated along the optical axis of the particle beam apparatus in the following order: particle beam generator, first condenser lens, second condenser lens, objective lens. In addition, the particle beam apparatus according to the system described herein may have at least a first aperture unit, which is situated between the particle beam generator and the first condenser lens. In addition to the first aperture unit, at least one second aperture unit may be provided, which is situated between the first condenser lens and the second condenser lens.

The first condenser lens may have a first pole shoe and a second pole shoe, the first pole shoe being situated first, followed by the second pole shoe, as viewed from the particle beam generator toward the objective lens. In other words, the above-mentioned components may be situated along the optical axis of the particle beam apparatus in the following order: particle beam generator, first aperture unit, first pole shoe, second pole shoe, second aperture unit, second condenser lens, objective lens. The first pole shoe may be referred to as the upper pole shoe, while the second pole shoe may be referred to as the lower pole shoe. Both the first pole shoe and the second pole shoe may be adjustable independently from each other relative to the second aperture unit. This means that the relative position of the first pole shoe to the second aperture unit is adjustable. The same applies to the second pole shoe. In addition, it is provided that the second aperture unit may be a pressure stage aperture separating a first area in which there is a vacuum at a first pressure from a second area in which there is a vacuum at a second pressure, the first pressure and the second pressure generally being different from each other.

The second aperture unit may, for example, be designed as a circular aperture having an opening for the particle beam to pass through, the opening extending over a range of between 10 μm and 100 μm, preferably 25 μm to 50 μm, for example, 35 μm.

The above-mentioned particle beam apparatus has two advantageous characteristics. On the one hand, the beam current of the particle beam is continuously variable over a wide range, for example, over a range from 10 pA to 300 nA. This is achieved by varying the excitation of the first condenser lens. On the other hand, the second aperture unit is designed as a pressure stage separating, for example, a first area in which the particle beam generator is situated and in which there is generally an ultra-high vacuum ($10^{-6}$ Pa to $10^{-10}$ Pa), from a second area having a high vacuum ($10^{-1}$ Pa to $10^{-5}$ Pa). The second area may, for example, be a sample chamber of the particle beam apparatus, in which a sample has been placed, or it may be an intermediate pressure area leading to the sample chamber. The second aperture unit prevents the ultra-high vacuum of the first area from being degraded by contaminants from the second area, for example, due to gases being introduced in the sample area. The pressure-tight installation of the second aperture unit designed as a pressure stage makes it more difficult to adjust it mechanically. Consequently, in order for the path of the primary electron beam to always remain mode-independent, adjustability relative to the second aperture unit has been provided both for the first pole shoe and the second pole shoe of the first condenser lens. Here, adjustment may be made independently for the first pole shoe and the second pole shoe. Upon consideration it was determined that adjusting the first condenser lens as a whole (i.e., adjusting the first pole shoe and the second pole shoe always simultaneously) is not sufficient for attaining a mode-independent beam path. Instead, the first pole shoe and the second pole shoe may be adjusted independently of each other.

When using a thin-film aperture as a second aperture unit, the second aperture unit may be heated up by a particle beam focused accordingly so that any contaminants deposited will be removed. A thin-film aperture shall be understood herein to be an aperture whose material thickness in the area of the aperture edge and in an area of at least double the diameter of the aperture opening (for example, approximately 100 µm) is less than 10 µm.

The beam current is set, for example, depending on the analysis method to be used. If an image of the object to be analyzed is to be generated, for example, the particle beam apparatus is set to its high resolution mode. For this purpose, a beam current in the range of, for example, 10 pA to 500 pA will be selected. If, however, working in the high current mode is desired in order to use, for example, the other analysis methods listed above, a beam current should be selected that is, for example, in the range of 10 nA to some 100's nA.

The second condenser lens also has a special function for the system described herein. By using the second condenser lens, the diameter of the particle bundle in the objective lens may be adjusted in such a way that results in good lateral resolution for a selected beam current.

In order to attain a particularly good and mode-independent beam path of the particle beam, it is provided, in an additional or alternative embodiment of the system described herein, that the second condenser lens may have a third pole shoe and a fourth pole shoe, with the third pole shoe being situated first, and then the fourth pole shoe, as viewed from the particle beam generator toward the objective lens. In other words, the above-mentioned components of the particle beam apparatus may be situated along the optical axis of the particle beam apparatus in the following order: particle beam generator, first aperture unit, first pole shoe, second pole shoe, second aperture unit, third pole shoe, fourth pole shoe, objective lens. The third pole shoe and the fourth pole shoe may be adjustable relative to the second aperture unit, together or independently of each other.

In an additional or alternative embodiment of the system described herein, it is provided that at least one deflection device may be situated between the first condenser lens and the second condenser lens. The deflection device may be, for example, designed as a deflection system having a first deflection unit and a second deflection unit. Such a deflection system is also referred to as a dual deflection system. It is provided, for example, that the second aperture unit may be situated between the first deflection unit and the second deflection unit. The particle beam, after it has passed through the second aperture unit, is deflected and adjusted relative to the second condenser lens with the aid of the deflection device, for example, with the aid of the deflection system described. This will also result in a good and mode-independent beam path of the particle beam.

In another additional or alternative embodiment of the system described herein, the first aperture unit may have an aperture opening having a variable opening size. This embodiment is, in particular, provided for the high-resolution mode. For example, the aperture unit may have an aperture opening with a first opening size and a second opening size, with the first opening size being larger than the second opening size. Changing the aperture opening from the first opening size to the second opening size will result in particles being blanked out of the particle beam early (i.e., at the first aperture unit). Otherwise, these particles would be blanked out at the second aperture unit anyway. This method reduces or prevents interactions—which may arise between the first aperture unit and the second aperture unit—of particles from the particle beam among each other. This counters a widening of the particle beam, resulting in improving the resolution when generating images. In this embodiment, the maximum beam current of the particle beam is determined by the maximum aperture opening of the first aperture unit.

In an additional or alternative embodiment of the system described herein, the first aperture unit may have a first aperture element and a second aperture element, the first aperture element and the second aperture element cooperating to create the aperture opening. In other words, the first aperture element and the second aperture element may be situated relative to each other in such a way that they form the aperture opening. The first aperture element and the second aperture element may be movable relative to each other to form the aperture opening. So, for example, either the first aperture element or the second aperture element may be designed movably. Alternatively, for example, both the first aperture element and the second aperture element may be designed movably.

In an additional or alternative embodiment of the system described herein, it may be further provided for the first aperture unit to have a first aperture stop element and a second aperture stop element. The first aperture element may be movable in such a way that it contacts the first aperture stop element to form the aperture opening. In addition or alternatively, it is provided that the second aperture element may be movable in such a way that it contacts the second aperture stop element to form the aperture opening. In another additional or alternative embodiment of the system described herein, it is provided that the first aperture unit may have a first stop element and a second stop element, the first aperture element being designed movably in such a way that it contacts the first stop element to form an aperture opening having a first opening size, or the second stop element for forming an aperture opening having a second opening size. The first opening size and the second opening size may be different. So, for example, the second opening size may be larger than the first opening size. Due to the first stop element and the second stop element, two positions are predetermined that the first aperture element may assume. In a first position, in which the first aperture element contacts the first stop element, the first aperture element cooperates with the second aperture element in such a way that the aperture opening having the first opening size is provided. In a second position, in which the first aperture element contacts the second stop element, the first aperture element cooperates with the second aperture element in such a way that the aperture opening having the second opening size is provided. The first stop element and the second stop element may, for example, be mounted on a base plate before installing the first aperture unit in the particle beam apparatus, and they are adjusted before the particle beam apparatus is started up. Consequently, it is possible to attain quite definite opening sizes of the aperture opening for the particle beam to pass through. The first opening size and the second opening size may, for example, lie in a range from approximately 10 µm to 500 µm, with, for example, the second opening size selected to be larger than the first opening size (or vice versa).

In an additional or alternative embodiment of the system described herein, the second aperture element may be designed movably. In addition, the first aperture unit may have a third stop element and a fourth stop element. The second aperture element may be designed movably in such a way that it contacts the third stop element or the fourth stop element to form the aperture opening. This exemplary embodiment allows setting the aperture opening both by moving the first aperture element and making contact between the first aperture element and the first stop element or the second stop element, as well as moving the second aperture element and making contact between the second aperture element and the third stop element or fourth stop element. Alternatively, it is also possible to move and make contact with only the first aperture element or only the second aperture element for the purpose of setting the aperture opening. Moving both the first aperture element and the second aperture element allows a particularly simple selection of a rather small first opening size of the aperture opening (for example, in the range from 10 µm to 100 µm) and a rather large second opening size of the aperture opening (for example, in the range from 50 µm to 500 µm).

In an additional or alternative embodiment of the system described herein, the above-mentioned first aperture stop element may be designed as the second stop element, while the above-mentioned second aperture stop element is designed as the third stop element.

In another additional or alternative exemplary embodiment of the system described herein, the first aperture unit may have at least one drive unit for moving the first aperture element and/or the second aperture element. It is, for example, provided that the first aperture unit may have a first drive unit for moving the first aperture element, and a second drive unit for moving the second aperture element. Alternatively, it is provided that an individual drive unit may move both the first aperture element and the second aperture element. The drive unit may have, for example, a piezoelectric element, an electromagnetic moving member and/or a bimetal element. As a piezoelectric element, for example, a flexural piezoelectric element, a piezoelectric inertia drive, a block piezoelectric element and/or a piezoelectric inchworm may be suitable. Any combination of metals which provides the required motion, and is, in particular, non-magnetic, and may be used in ultra-high vacuums without having a strong effect on it, may be suitable as a bimetal element. The above list of drive units is not all-encompassing. Instead, any drive unit suitable for the system described herein may be used.

For supplying and controlling the drive unit, for example, the above-mentioned piezoelectric element or the above-mentioned electromagnetic moving member, for example, a supply unit is provided that supplies a voltage to the drive unit equaling the control voltage of the drive unit. If the drive unit is designed as a bimetal element, a supply unit is provided that supplies to or dissipates heat from the drive unit. The supply unit may be, for example, situated inside a high-voltage supply unit of the particle beam apparatus. Supply unit control signals are transmitted to the drive unit via a high-voltage supply line. In addition it is, for example, provided that the drive unit may be designed to be controllable using an optical signal. For this purpose, the drive unit may have, for example, an optical sensor that may be illuminated via a light beam for switching the optical sensor. The optical sensor, in turn, controls the drive unit. If an optical sensor on the drive unit is unwanted, an additional and alternative embodiment of the system described herein provides that, for example, the bimetal element may be designed as the drive unit to be irradiated and heated by injecting a light beam (for example, a laser beam) into the particle beam apparatus in order to attain the required flexing for a drive. In the above-mentioned embodiments it is advantageous that the installation space between the particle beam generator and the first condenser lens is generally small, and the drive unit may thus be controlled without additional installation space for control input lines having to be provided In an additional or alternative embodiment of the system described herein, the first aperture element and the second aperture element of the first aperture unit may be connected by an elastic connecting element. It is, for example, provided that the elastic connecting element may be designed as a bimetal element. In this exemplary embodiment, the drive unit may have a greater adjustment path than actually required for moving the first aperture element from the first stop element to the second stop element or to move the second aperture element from the third stop element to the fourth stop element. The elastic connecting element compensates for the adjustment path not needed. Consequently, errors in setting the adjustment path, in particular due to mechanical imprecision, will no longer result in other than the desired opening sizes of the aperture opening. In one embodiment of the system described herein, an adjustment path may always be selected that is larger than the path the first aperture element or the second aperture element has to travel between the first and second stop elements or the third and fourth stop elements. After the first aperture element has contacted the first stop element or the second stop element, and after the second aperture element has contacted the third stop element or the fourth stop element, the adjustment path, which is provided by the drive unit, but not needed, is taken up (i.e., compensated) by the elastic connecting element.

In an additional or alternative exemplary embodiment of the system described herein, the first aperture element and/or the second aperture element may be, at least partially, designed elastically. This results in a similar effect and advantage with regard to the elastic connecting element as explained above. In this exemplary embodiment it is, in particular, provided that the first aperture element may have a first jointed part and a second jointed part connected by a first joint. Alternatively or additionally, it is provided that the second aperture element may have a third jointed part and a fourth jointed part connected via a second joint. For example, the first joint and/or the second joint may be designed elastically. The first joint and/or the second joint may be designed as a solid joint. The solid joint is characterized by the fact that it has a location in which its flexural stiffness is decreased. This location also ensures that the first jointed part and the second jointed part are integrally bonded to each other. This applies accordingly to the third and the fourth jointed part. The reduced flexural stiffness is generally attained by a local decrease in diameter. The decrease in diameter may have different geometric shapes. Solid joints are characterized by the fact that they may perform a motion without additional maintenance and without friction.

In an additional or alternative exemplary embodiment of the system described herein, the first aperture stop element, the second aperture stop element, the first stop element, the second stop element, the third stop element and/or the fourth stop element may be designed eccentrically. This allows positioning the above-mentioned stop elements precisely so that the desired opening size of the aperture opening results. The eccentric elements are set, for example, before the first aperture unit is installed in the particle beam apparatus.

In an additional or alternative exemplary embodiment of the particle beam apparatus, the first aperture unit may be at a potential in the range from 1 kV to 20 kV relative to a ground potential, for example, 5 kV to 15 kV, in particular 8 kV. The ground potential is, for example, the potential of a sample chamber housing. The first aperture unit may be at the same potential as an anode of the particle beam generator. Thus, particles generated using the particle beam generator may be accelerated to the anode potential without problems. With the aid of a deceleration device, which will be explained in greater detail below, the particles may then be decelerated to the desired potential required for the further analysis of the sample.

An aperture unit according to the system described herein may have an adjustable aperture opening and be designed to be installed in a particle beam apparatus. In addition, the aperture unit may have a first aperture element and a second aperture element, with the first aperture element and the second aperture element cooperating to form the aperture opening. In addition, the aperture unit may have a first stop element, the first aperture element being movable in such a way that it contacts the first stop element to form the aperture opening. The aperture unit may have the same characteristics and advantages already listed above. Below, a few special features of the aperture unit will be stated, with the aperture unit, however, being able in all cases to have individual features or a combination of features that have been listed above.

According to an exemplary embodiment of the aperture unit, the aperture unit may have a second stop element. In addition, the first aperture element may be movable in such a way that it contacts the first stop element to form an aperture opening having a first opening size or contacts the second stop element to form the aperture opening having a second opening size. In an additional or alternative embodiment, the second aperture element may be designed movably. The aperture unit may have a third stop element, the second aperture element being movable in such a way that it contacts the third stop element to form the aperture opening. In another additional or alternative embodiment, the aperture unit may have a fourth stop element. The second aperture element may be movable in such a way that it contacts the third stop element or the fourth stop element to form the aperture opening.

In an additional or alternative exemplary embodiment of the aperture unit, it is provided that the aperture unit may have at least one drive unit for moving the first aperture element and/or the second aperture element. In particular, it is provided that the drive unit may have a piezoelectric element, an electromagnetic moving member and/or a bimetal element. In addition, it is provided, in particular, that the drive unit may have a supply unit which supplies voltage to the drive unit. Alternatively or additionally, it is provided that the drive unit may have a supply unit that supplies heat to, or dissipates heat from, the drive unit. In an additional exemplary embodiment it is provided that the drive unit may be controlled using an optical signal.

In an additional or alternative exemplary embodiment of the aperture unit, the first aperture element and the second aperture element may be connected by an elastic connecting element. In particular, it is provided that the elastic connecting element may be designed as a bimetal element.

In an additional or alternative exemplary embodiment of the aperture unit, the first aperture element and/or the second aperture element may be, at least partially, designed elastically. In particular, it is provided that the first aperture element may have a first jointed part and a second jointed part connected by a first joint. Alternatively or additionally, it is provided that the second aperture element may have a third jointed part and a fourth jointed part connected to each other by a second joint. In particular, it is provided that the first joint and/or the second joint may be designed elastically. The first and/or the second joint may be, for example, designed as a solid joint.

In an additional or alternative exemplary embodiment of the aperture unit, the first stop element, the second stop element, the third stop element and/or the fourth stop element may be designed eccentrically.

A method according to the system described herein is provided using which good image resolution may be attained when generating images. The method is used to vary a beam current of a particle beam in a particle beam apparatus having a particle beam generator for generating a particle beam, an objective lens for focusing the particle beam on a sample, a first condenser lens and a second condenser lens, the first condenser lens being situated first, and then the second condenser lens, as viewed from the particle beam generator toward the objective lens. In addition, the particle beam apparatus may have a first aperture unit situated between the particle beam generator and the first condenser lens, and a second aperture unit situated between the first condenser lens and the second condenser lens. The first aperture unit may have an aperture opening having a variable opening size, the opening size being variable at least between a first opening size and a second opening size, the first opening size being larger than the second opening size. The method includes changing excitation of the first condenser lens, wherein for a first beam current (for example, in the range from 10 nA to some 100's nA) a crossover of the particle beam is generated in the area of the second aperture unit (for example, in the immediate vicinity of the second aperture unit) and wherein for a second beam current (for example, in the range from 10 pA to 1 nA) a crossover of the particle beam is generated at a predetermined distance from the second aperture unit, the first beam current being greater than the second beam current. When defining the distance from the principal plane of the first condenser lens to the second aperture unit as D, and the distance of the crossover to the principal plane of the first condenser lens as L, the following applies. If $$L<0.45\times D \quad\quad\quad \text{[Formula 1]}$$

applies, the particle beam apparatus is being operated in high resolution mode (beam current for example in the range from approximately 10 pA to 500 pA). If $$0.75\times D<L<1.25\times D \quad\quad\quad \text{[Formula 2]}$$

applies, the particle beam apparatus is being operated in high current mode (beam current for example in the range from 10 nA to 300 nA). If $$0.45\times D<L<0.75\times D \quad\quad\quad \text{[Formula 3]}$$

applies, the particle beam apparatus is being operated in a transitional range, in which the first aperture unit should be selected in an appropriate location with a large aperture opening, if the beam current is not to be limited.

In addition, the method may include a step—for the purpose of reducing the expansion of energy width and virtual source size—of setting the first aperture unit to the second opening size for the second beam current. Changing the aperture opening from the first opening size to the second opening size results in the particles being blanked out from the particle beam early on (i.e., at the first aperture unit). Otherwise, the particles would be blanked out at the second aperture unit anyway. This reduces or prevents interactions of particles in the particle beam with each other that may arise between the first aperture unit and the second aperture unit. This results in improved resolution when generating images.

With increasing L, the beam current will increase and resolution will decrease. In high-resolution mode, resolution will decrease moderately (for example, from 1.4 nm to 2 nm with the beam current increasing from 10 pA to 500 pA). In high-current mode, resolution will no longer be so good. It may, for example, be around 5 nm. But it may well also decrease even more.

In an additional exemplary embodiment of the method, for a third beam current smaller than the first beam current and greater than the second beam current, the first condenser lens and the second condenser lens may be operated in such a way that a crossover of the particle beam between the particle beam generator and the objective lens does not occur. This setting is also referred to as the crossover-free mode. The crossover-free mode overlaps with the high resolution mode in the upper beam current range of the latter (200 pA to 500 pA), for example, if $$0.3 \times D < L < 0.45 \times D \quad \text{[Formula 4]}$$

applies,

In this overlap, the crossover-free mode results—due to the lack of crossover—in a somewhat better resolution than the high-resolution mode (if the two modi are compared at the same beam current). For a beam current smaller than 200 pA for which $$L < 0.3 \times D \quad \text{[Formula 5]}$$

then applies,
the only mode of operation remaining will be the high-resolution mode. In this mode, the particle beam apparatus will attain its best resolution.

The range values mentioned above are examples only. They may change depending on predefinable parameters, for example, the types of lenses used and/or the aperture diameters.

BRIEF DESCRIPTION OF THE DRAWINGS

Embodiments of the system described herein will be explained in detail using the figures of the drawings, which are briefly described as follows.

DETAILED DESCRIPTION OF VARIOUS EMBODIMENTS

The system described herein is explained in greater detail with the aid of a particle beam apparatus in the form of an SEM. It should, however, be noted that the system described herein is not limited to an SEM. Instead, the system described herein may be implemented in any particle beam apparatus, in particular an ion beam apparatus.

Figure 1:
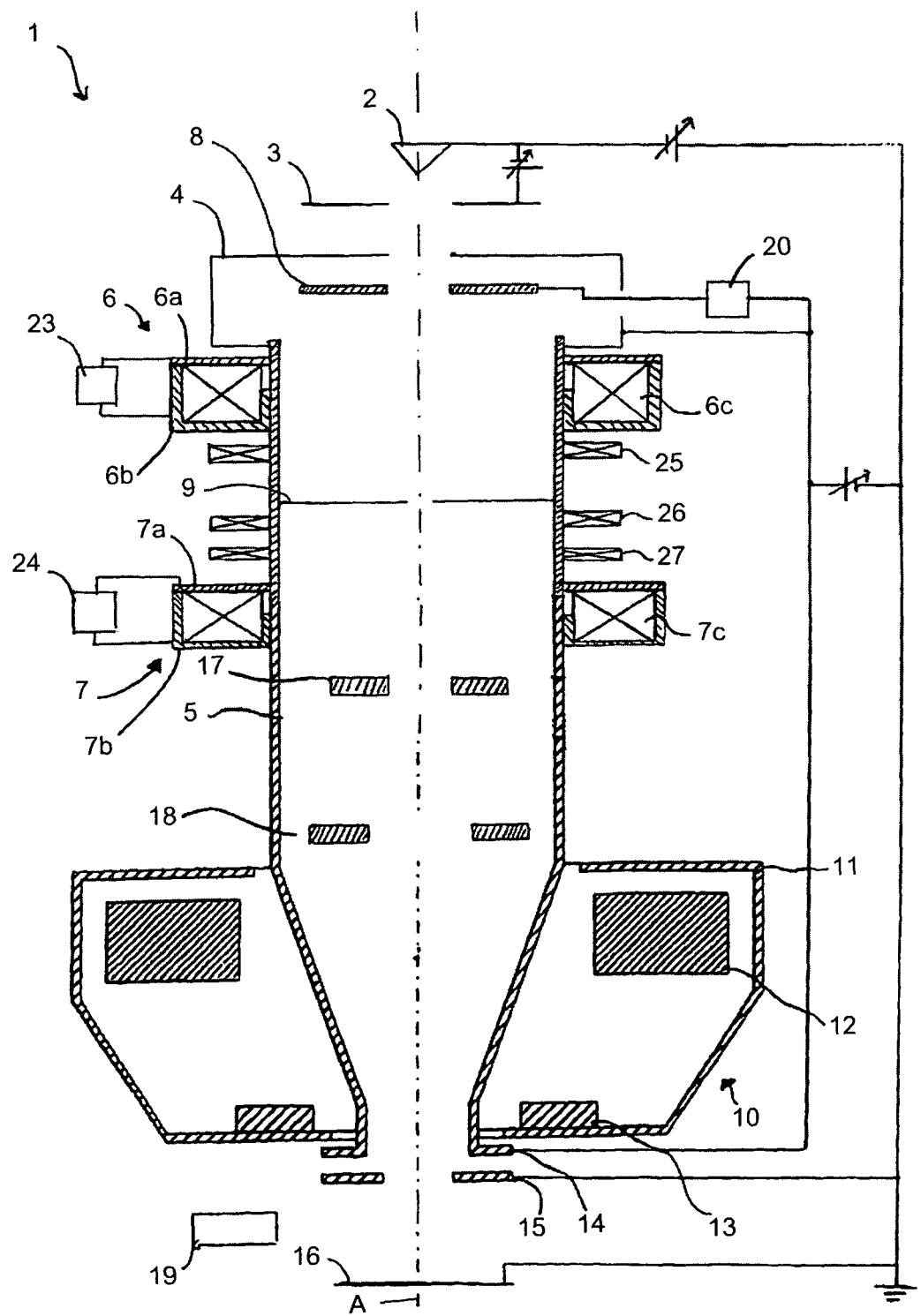
FIG. 1 shows a schematic representation of an SEM with an aperture unit whose aperture opening is adjustable according to an embodiment of the system described herein.

FIG. 1 shows a schematic representation of an SEM 1 according to an embodiment of the system described herein. SEM 1 has a beam generator in the form of an electron source 2 (cathode), an extraction electrode 3, and an anode 4 which is placed on the end of a beam guide tube 5 of SEM 1. The electron source 2 is, for example, designed as a thermal field emitter. However, the system described herein is not limited to such an electron source. Instead, any electron source may be used.

Electrons emerging from electron source 2 form a primary electron beam. Due to a potential difference between electron source 2 and anode 4, the electrons are accelerated to the anode potential. The anode potential in this exemplary embodiment is between 1 kV and 20 kV relative to the ground potential of a sample chamber (not shown), for example, 5 kV to 15 kV, in particular 8 kV, but alternatively, it could also be at ground potential.

Two condenser lenses are situated on beam guide tube 5, i.e., a first condenser lens 6 and a second condenser lens 7, first condenser lens 6 being situated first, and then second condenser lens 7, as viewed from electron source 2 toward objective lens 10.

First condenser lens 6 has a first pole shoe 6a and a second pole shoe 6b, first pole shoe 6a being situated first, and then second pole shoe 6b, as viewed from electron source 2 toward objective lens 10. Second condenser lens 7 has a similar design, a third pole shoe 7a and a fourth pole shoe 7b being provided. Third pole shoe 7a is situated first, and then fourth pole shoe 7b, as viewed from electron source 2 toward objective lens 10. First pole shoe 6a (or third pole shoe 7a) is frequently also referred to as the upper pole shoe, while second pole shoe 6b (or fourth pole shoe 7b) is frequently also referred to as the lower pole shoe.

A first aperture unit 8 is situated between anode 4 and first condenser lens 6. First aperture unit 8 is, together with anode 4 and beam guide tube 5, at high-voltage potential, i.e. the potential of anode 4, or at ground. A stationary second aperture unit 9 is situated between first condenser lens 6 and second condenser lens 7. More details on the function and effects of first condenser lens 6, second condenser lens 7, first aperture unit 8, and second aperture unit 9 may be found below.

First pole shoe 6a and second pole shoe 6b of first condenser lens 6 are adjustable independently of each other and relative to second aperture unit 9 via a first adjusting mechanism 23. This means that the relative position of first pole shoe 6a to second aperture unit 9 is adjustable. This principle applies accordingly to second pole shoe 6b. Third pole shoe 7a and fourth pole shoe 7b of second condenser lens 7 are also adjustable together or independently of each other relative to second aperture unit 9 via a second adjusting mechanism 24.

A first coil 6c is situated in first condenser lens 6, while a second coil 7c is situated in second condenser lens 7. The required magnetic excitation of first pole shoe 6a and second pole shoe 6b or third pole shoe 7a and fourth pole shoe 7b is attainable with the aid of first coil 6c and second coil 7c.

Objective lens 10 has objective lens pole shoes 11, in which a bore has been made. Beam guide tube 5 is routed through this bore. Further, a third coil 12 is situated in pole shoes 11. An electrostatic deceleration device is situated downstream from beam guide tube 5. It has a single electrode 15 and a tube electrode 14 formed on the end of beam guide tube 5 facing a sample 16. Consequently, tube electrode 14 is, together with beam guide tube 5, at the potential of anode 4, while single electrode 15 and sample 16 are at a lower potential than that of anode 4. In this case, this is the ground potential of the sample chamber housing (not shown). Thus the electrons of the primary electron beam may be decelerated to the desired energy required for analyzing sample 16.

In addition, SEM 1 has a scanner 13, via which the primary electron beam may be deflected and scanned via sample 16. In this process, the electrons of the primary electron beam interact with sample 16. As a consequence of this interaction, interaction particles and/or interaction radiation will result, which are detected. The detection signals obtained in this manner are evaluated.

As interaction particles, in particular electrons are emitted from the surface of sample 16 (so-called secondary electrons) or electrons of the primary electron beam are scattered back (so-called backscattered electrons). For detecting secondary electrons and/or backscattered electrons, a detector system which has a first detector 17 and a second detector 18 is situated in beam guide tube 5. Here, first detector 17 is situated on the source-side along optical axis A, while second detector 18 is situated on the sample-side along optical axis A in beam guide tube 5. In addition, first detector 17 and second detector 18 are situated offset against each other toward optical axis A of SEM 1. Both first detector 17 and second detector 18 each have a through opening through which the primary electron beam may pass, and they are approximately at the potential of anode 4 and beam guide tube 5. Optical axis A of SEM 1 passes through the corresponding through openings.

Second detector 18 is used to detect those electrons exiting from sample 16 at a relatively large spatial angle. Those are primarily secondary electrons. Electrons backscattered on sample 16 (backscattered electrons), which have a relatively high kinetic energy—as compared to secondary electrons—when exiting from sample 16, are, however, detected only to a very small degree by second detector 18 since the backscattered electrons are focused relatively close to optical axis A by objective lens 10, which allows them to pass through the through opening of second detector 18. Consequently, first detector 17 is used to capture the backscattered electrons. The detection signals generated by first detector 17 and second detector 18 are used to generate an image or images of the surface of sample 16.

It should be pointed out expressly that the aperture openings of first aperture unit 8 and second aperture unit 9 as well as the through openings of first detector 17 and second detector 18 are schematically represented in an exaggerated manner. The through openings of first detector 17 and second detector 18 have a maximum length of between 1 mm and 5 mm. For example, they have a circular design and a diameter in the range of 1 mm to 3 mm. The size of the aperture openings of first aperture unit 8 and second aperture unit 9 will be explained in greater detail below.

In the exemplary embodiment shown here, second aperture unit 9 is designed as a circular aperture having an opening for the primary electron beam to pass through, the opening having an extension in the range of 25 μm to 50 μm, for example, 35 μm. Second aperture unit 9 is designed as a pressure stage aperture. It separates a first area, in which electron source 2 is situated, having an ultra-high vacuum ($10^{-6}$ to $10^{-10}$ Pa), from a second area with a high vacuum ($10^{-1}$ to $10^{-5}$ Pa). The second area is the intermediate pressure area of beam guide tube 5 leading to the sample chamber (not shown). This will also be explained in greater detail below.

In addition to image generation, there are additional analysis methods that may be used to analyze sample 16 with the aid of SEM 1. They include the EBSD method (Electron Backscattered Diffraction), in which the diffraction patterns of the scattered electrons are determined. Another analysis method is based on detecting cathodoluminescence light, which exits sample 16 when sample 16 is impinged upon by the primary electron beam. Additional analysis methods include, for example, analysis of energy-dispersive X-ray spectroscopy (EDX) and analysis of wavelength-dispersive X-ray spectroscopy (WDX). For these additional analysis methods, at least one third detector 19 is provided, which is situated in the area between beam guide tube 5 and sample 16. Additional third detectors 19 may also be provided (not shown).

As mentioned above already, SEM 1 may be operated in high-resolution mode for attaining sufficiently good resolution in images of the surface of sample 16. For the additional analysis methods, however, high count rates are required, which is why SEM 1 may be operated in high-current mode.

Figure 2:
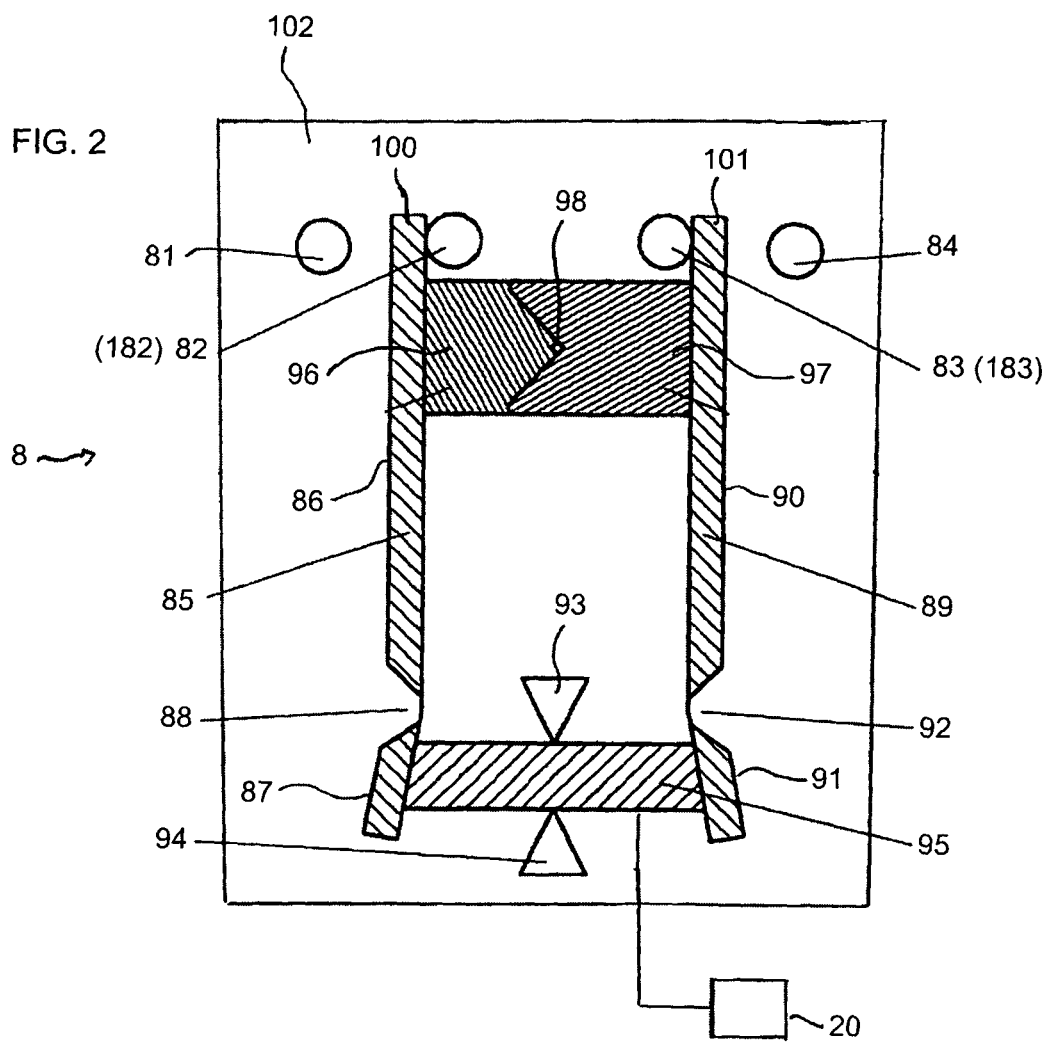
FIG. 2 shows a schematic representation of a first exemplary embodiment of an aperture unit having an adjustable aperture opening according to an embodiment of the system described herein.
Figure 3:
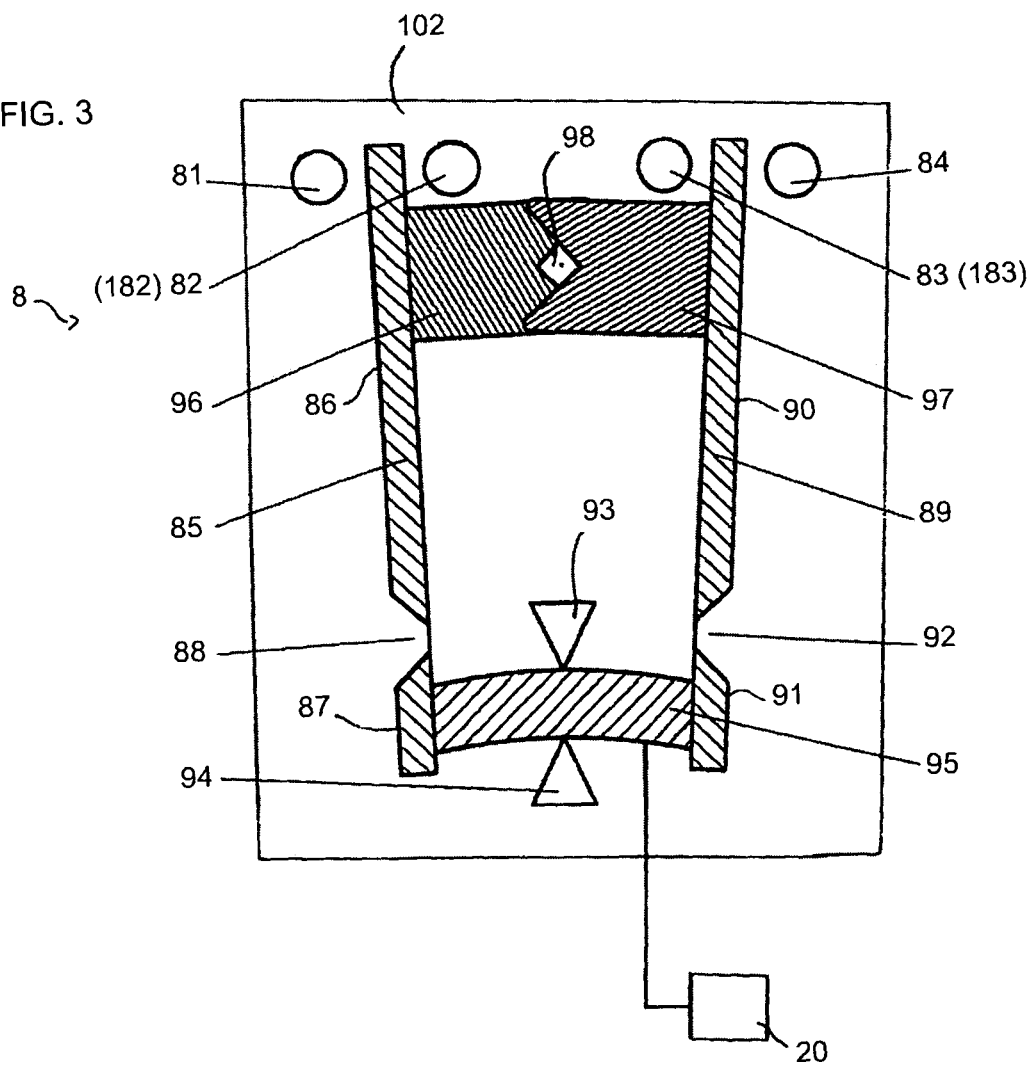
FIGS. 3 and 4 show additional representations of the aperture unit according to FIG. 2.
Figure 4:
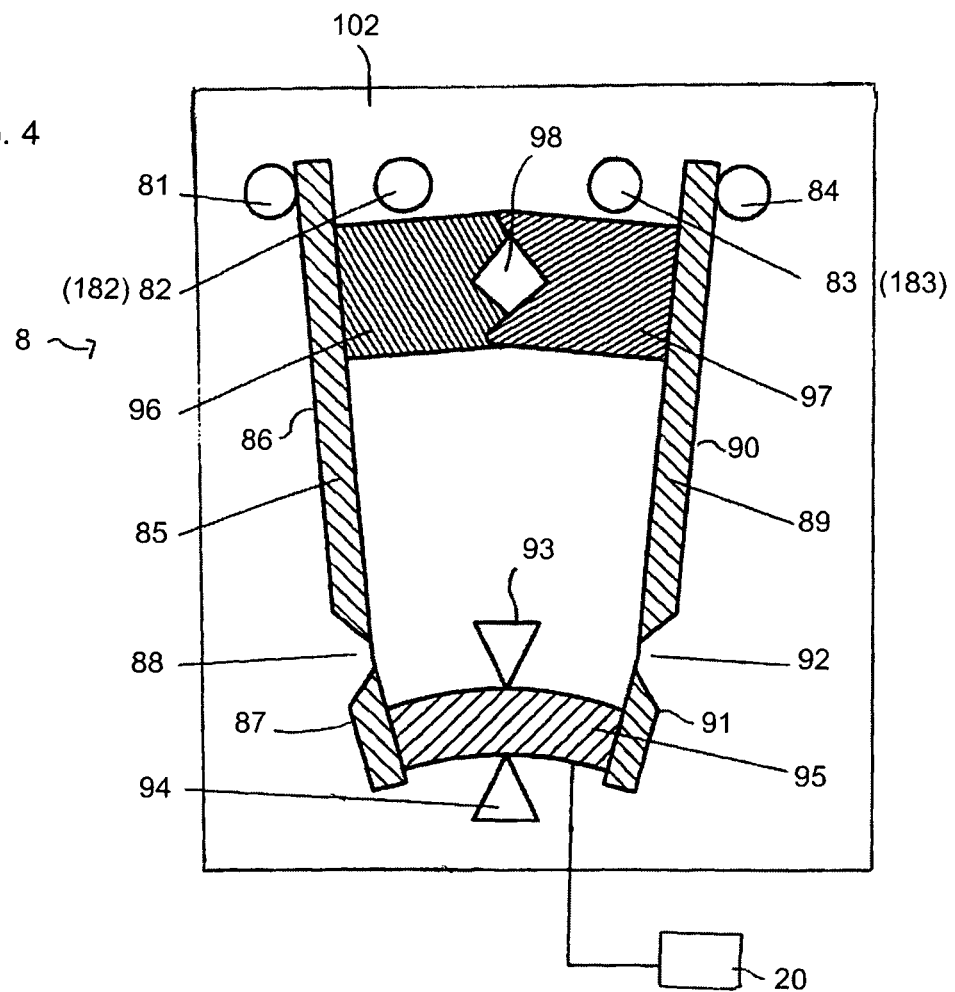

In order to be able to toggle between the two modi (high-resolution mode and high-current mode), first condenser lens 6 is first appropriately excited. This continuously varies the beam current, for example, in a range from 10 pA to 300 nA. In high-resolution mode it is now also possible to select a different aperture opening for first aperture opening 8 in order to thus blank out electrons early on from the primary electron beam which are otherwise blanked out at second aperture unit 9 anyway. FIGS. 2 through 4 show an embodiment of first aperture unit 8 in schematic representations, as it is provided for and used in SEM 1 according to FIG. 1. First aperture unit 8 has a first aperture element 85 having a first jointed part 86 and a second jointed part 87. First jointed part 86 and second jointed part 87 are connected to each other by a first joint 88. In addition, a second aperture element 89 which has a third jointed part 90 and a fourth jointed part 91 is provided for first aperture unit 8. Third jointed part 90 and fourth jointed part 91 are connected to each other by a second joint 92.

First joint 88 and second joint 92 are each designed elastically and as a solid joint. The solid joint is characterized by the fact that it has a location where its flexural stiffness is reduced. Both first joint 88 and second joint 92 each have an axis of motion running essentially in parallel to optical axis A of SEM 1. Optical axis A is perpendicular to the sheet plane of FIGS. 2 through 4.

Between second jointed part 87 of first aperture element 85 and fourth jointed part 91 of second aperture element 89, a piezoelectric element 95 is situated that is held by a first fastening element 93 and a second fastening element 94. Piezoelectric element 95 is designed as a flexural piezoelectric element (i.e., as a flexural actuator). But it should be expressly pointed out that the system described herein is not limited to a flexural piezoelectric element. To the contrary, any suitable drive unit is usable; for example, a piezoelectric inertia drive, a block piezoelectric element and/or a piezoelectric inchworm. Piezoelectric element 95 is connected to a control and supply unit 20 which is also shown in FIG. 1. Control and supply unit 20 is situated and switched in such a way that its control and supply signals are superimposed on the anode voltage of first aperture unit 8.

On first jointed part 86 of first aperture unit 8, a first limiting element 96 is situated. A similar principle applies to third jointed part 90 of second aperture element 89, where a second limiting element 97 is situated. Both first limiting element 96 and second limiting element 97 each have V-shaped notches that cooperate to form an aperture opening 98. First limiting element 96 and second limiting element 97 overlap each other and may be moved in opposite directions from each other. This allows setting the size of aperture opening 98, as will be explained in greater detail below.

Figure 5:
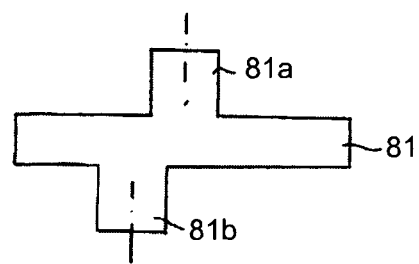
FIG. 5 shows a schematic representation of a stop element according to an embodiment of the system described herein.

In the area of first end 100 of first jointed part 86, a first stop element 81 and a second stop element 82 are situated. In addition, in the area of a second end 101 of third jointed part 90, a third stop element 83 and a fourth stop element 84 are situated. FIG. 5 shows first stop element 81 in a schematic representation. The additional stop elements have the same design. First stop element 81 is eccentrically designed, having a limiting part 81a and a guiding element 81b. Guiding element 81b is mounted in a base plate 102, which is shown schematically in FIGS. 2 through 4. Abovementioned stop elements 81 through 84, first fastening element 93, and second fastening element 94 are situated on this base plate.

As shown in FIGS. 2 and 4, there are two settings in which, on the one hand, first jointed part 86 contacts second stop element 82 and third jointed part 90 contacts third stop element 83 (FIG. 2), and on the other hand, first jointed part 86 contacts first stop element 81, and third jointed part 90 contacts fourth stop element 84 (FIG. 4). These two settings provide aperture opening 98 with a first opening size (FIG. 2) and with a second opening size (FIG. 4). In this context, as well as previously and hereafter, "opening size" shall mean a one-dimensional size (extension) describing the diameter of one of the aperture openings or the maximum distance between an edge of first limiting element 96 and an edge of second limiting element 97. Due to the fact that first stop element 81, second stop element 82, third stop element 83 and fourth stop element 84 are eccentrically designed, it is possible to position the above-mentioned stop elements exactly so that a desired opening size of aperture opening 98 (first opening size or second opening size) is attained, with the first opening size and the second opening size each being represented by the greatest extension of aperture opening 98 in one direction. Here, the above-mentioned stop elements are set, for example, before first aperture unit 8 is installed in SEM 1. The first opening size and the second opening size lie, for example, in the range of approximately 10 µm to 500 µm. In addition, the second opening size is selected to be greater than the first opening size (or vice versa). The first opening size is, for example, 50 µm and the second opening size is 200 µm.

On SEM 1, it is now possible—by controlling piezoelectric element 95—to toggle between the first opening size and the second opening size by moving first aperture element 85 and second aperture element 89. FIG. 2 shows piezoelectric element 95 in a non-excited state. In this state, first joint 88 and second joint 92 are pre-tensioned in such a way that first jointed part 86 contacts second stop element 82, and third jointed part 90 contacts third stop element 83. First limiting element 96 and second limiting element 97 overlap each other and cooperate so that aperture opening 98 assumes the first opening size. FIG. 3 shows a transitional state. In this state, piezoelectric element 95 has been excited in such a way that it is bending slightly. This moves first jointed part 86 in such a way that it becomes located between first stop element 81 and second stop element 82. In addition, third jointed part 90 is moved in such a way that it becomes located between third stop element 83 and fourth stop element 84. First joint 88 and second joint 92 are relaxed. FIG. 4 in turn shows a state in which piezoelectric element 95 is excited and bent in such a way that first jointed part 86 contacts first stop element 81 and that third jointed part 90 contacts fourth stop element 84. First joint 88 and second joint 92 are again tensioned. First limiting element 96 and second limiting element 97 overlap each other and cooperate in such a way that aperture opening 98 assumes the second opening size.

As mentioned above, first joint 88 and second joint 92 are elastically designed. In addition, it is provided for piezoelectric element 95 to be excited in such a way that the adjustment path provided is greater than the actual path required for moving first jointed part 86 and second jointed part 90 between the corresponding stop elements. After first jointed part 86 has contacted first stop element 81 or second stop element 82, and third jointed part 90 has contacted third stop element 83 or fourth stop element 84, the adjustment path not needed—which is still provided by piezoelectric element 95 due to its bending—is taken up (i.e., compensated) by the elastic embodiment. This prevents errors due to mechanical imprecisions that result in opening sizes for the aperture opening other than the first opening size or the second opening size.

As mentioned elsewhere herein, the beam current of the primary electron beam is continuously variable over a pre-determinable range, for example, in a range from 10 pA to 300 nA. This is achieved by varying the excitation of first condenser lens 6.

Second aperture unit 9 is designed as a pressure stage aperture, as mentioned above already. Second aperture unit 9 prevents the ultra-high vacuum of the first area from being degraded by contaminants from the second area, for example, due to gases being introduced in the sample area.

In order for the path of the primary electron beam to always remain mode-independent, it has been provided for both first pole shoe 6a and second pole shoe 6b of first condenser lens 6 to be adjustable relative to second aperture unit 9 with the aid of first adjusting mechanism 23. Here, adjustment for first pole shoe 6a and second pole shoe 6b is made independently of each other. Deliberations have shown that adjusting first condenser lens 6 as a whole (i.e., always adjusting first pole shoe 6a and second pole shoe 6b together) is not sufficient for attaining a mode-independent beam path. Instead, the first pole shoe 6a and second pole shoe 6b may be adjusted independently of each other.

In order to attain a particularly good and mode-independent beam path of the primary electron beam, this exemplary embodiment provides for third pole shoe 7a and fourth pole shoe 7b of second condenser lens 7 to be adjustable relative to second aperture unit 9 together or independently of each other using a second adjusting mechanism 24. Alternatively, it has been provided for the primary electron beam to be deflected in the area between second aperture unit 9 and sample 16 using a deflection system comprising a first deflection unit 25, a second deflection unit 26 and a third deflection unit 27 in such a way that a mode-independent beam path is attainable. It should, however, be expressly pointed out that the system described herein is not limited to the above number of deflection units. Instead, only one deflection unit may be provided, or two deflection units, or even more than three deflection units.

Figure 7:
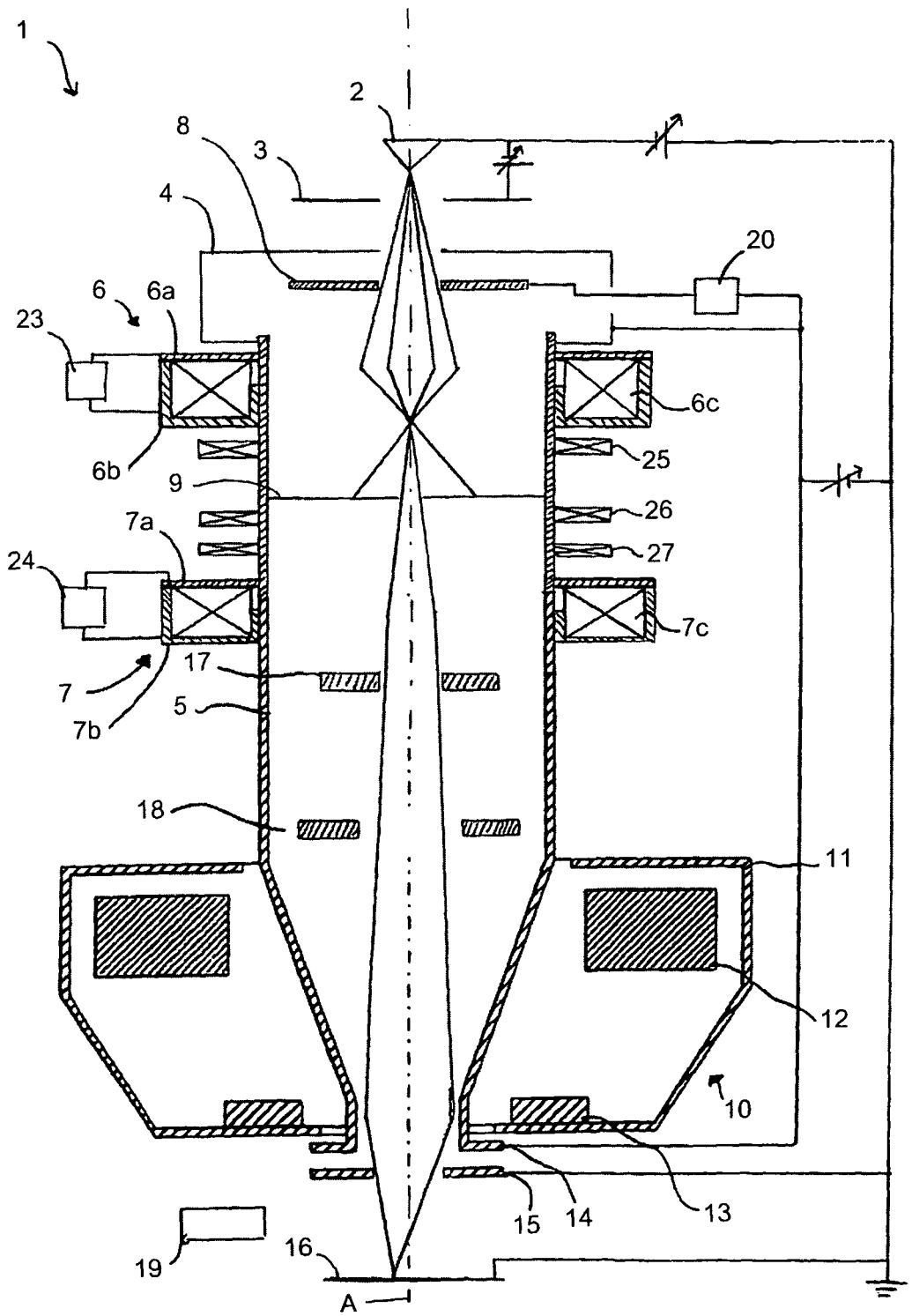
FIG. 7 shows an additional schematic representation of the SEM in FIG. 1 in high-resolution mode.

FIG. 7 shows SEM 1 according to FIG. 1 with a part of the beam path of the primary electron beam. The diameter of the particle bundle is represented here and in the following figures in an exaggerated size. SEM 1 is in high-resolution mode in FIG. 7. First condenser lens 6 is excited in such a way that a crossover of the primary electron beam is situated relatively close to electron source 2. If the distance between a principal plane of first condenser lens 6 and second aperture unit 9 is defined as D, and the distance between the crossover and the principal plane of first condenser lens 6 is defined as L, in high-resolution mode $$L<0.45\times D \qquad \text{[Formula 1]}$$

will apply,
where the beam current, for example, is in the range of approximately 10 pA to 500 pA. At the same time, a small aperture opening is selected on first aperture unit 8. Thus a large part of the primary electron beam, which would otherwise be blanked out anyway at second aperture unit 9, is already blanked out at first aperture unit 8. What is achieved hereby is that the interactions of the electrons remaining in the primary electron beam among each other are so negligible that a widening of the primary electron beam is prevented. Consequently, good resolution may be achieved when generating images.

Figure 8:
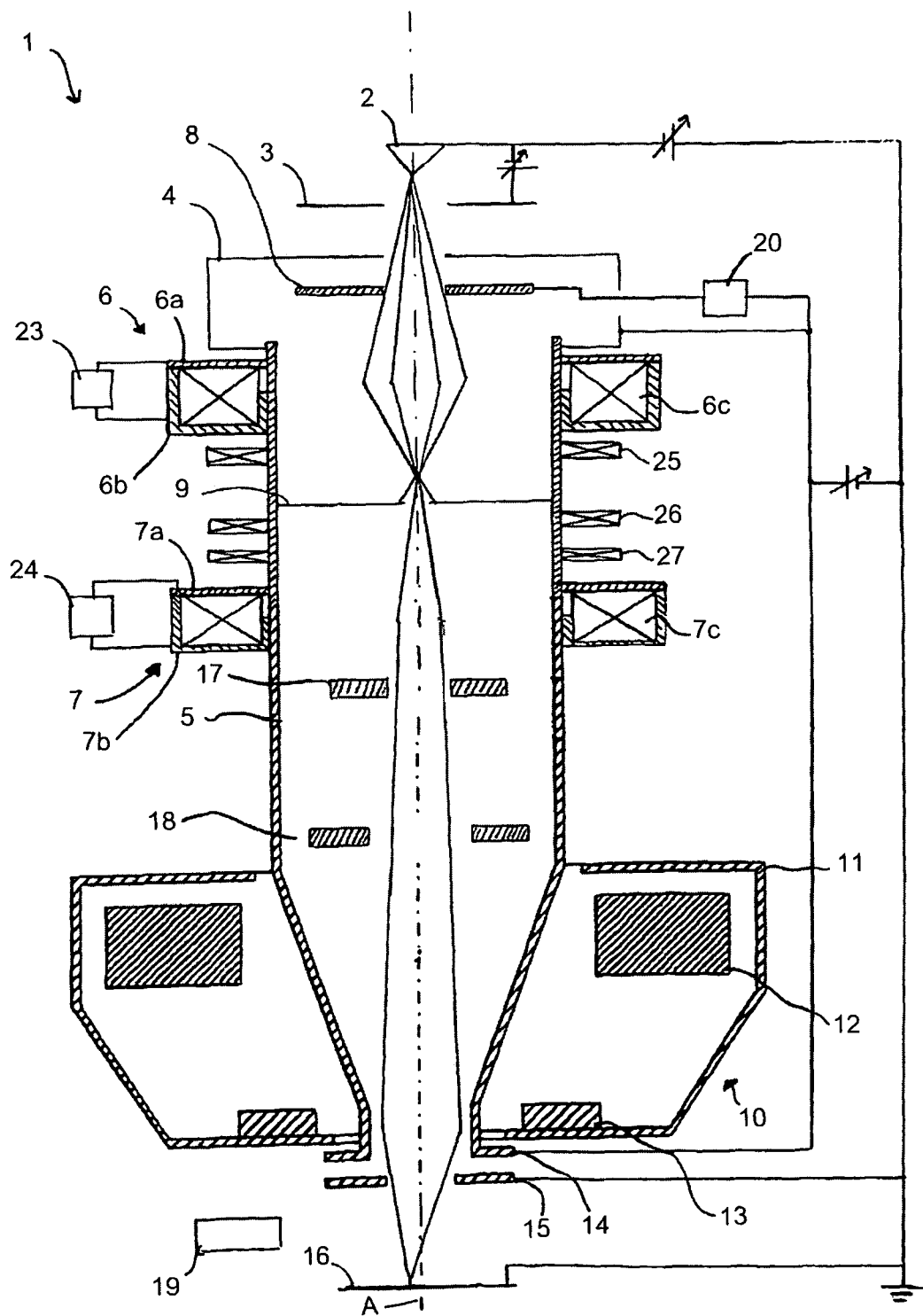
FIG. 8 shows an additional schematic representation of the SEM in FIG. 1 in high-current mode.

FIG. 8 shows SEM 1 from FIG. 1 again with a part of the beam path of the primary electron beam in high-current mode. First condenser lens 6 is excited in such a way that a crossover of the primary electron beam is attained in the vicinity of second aperture unit 9. Here, the crossover lies between first condenser lens 6 and second aperture unit 9. Alternatively it is also possible, however, to arrange the crossover between second aperture unit 9 and second condenser lens 7. Thus it is possible to let a large part of primary electron beam pass through second aperture unit 9. In high-current mode $$0.75\times D<L<1.25\times D \qquad \text{[Formula 2]}$$

applies,
where the beam current is, for example, in the range from 10 nA to 300 nA.

Figure 9:
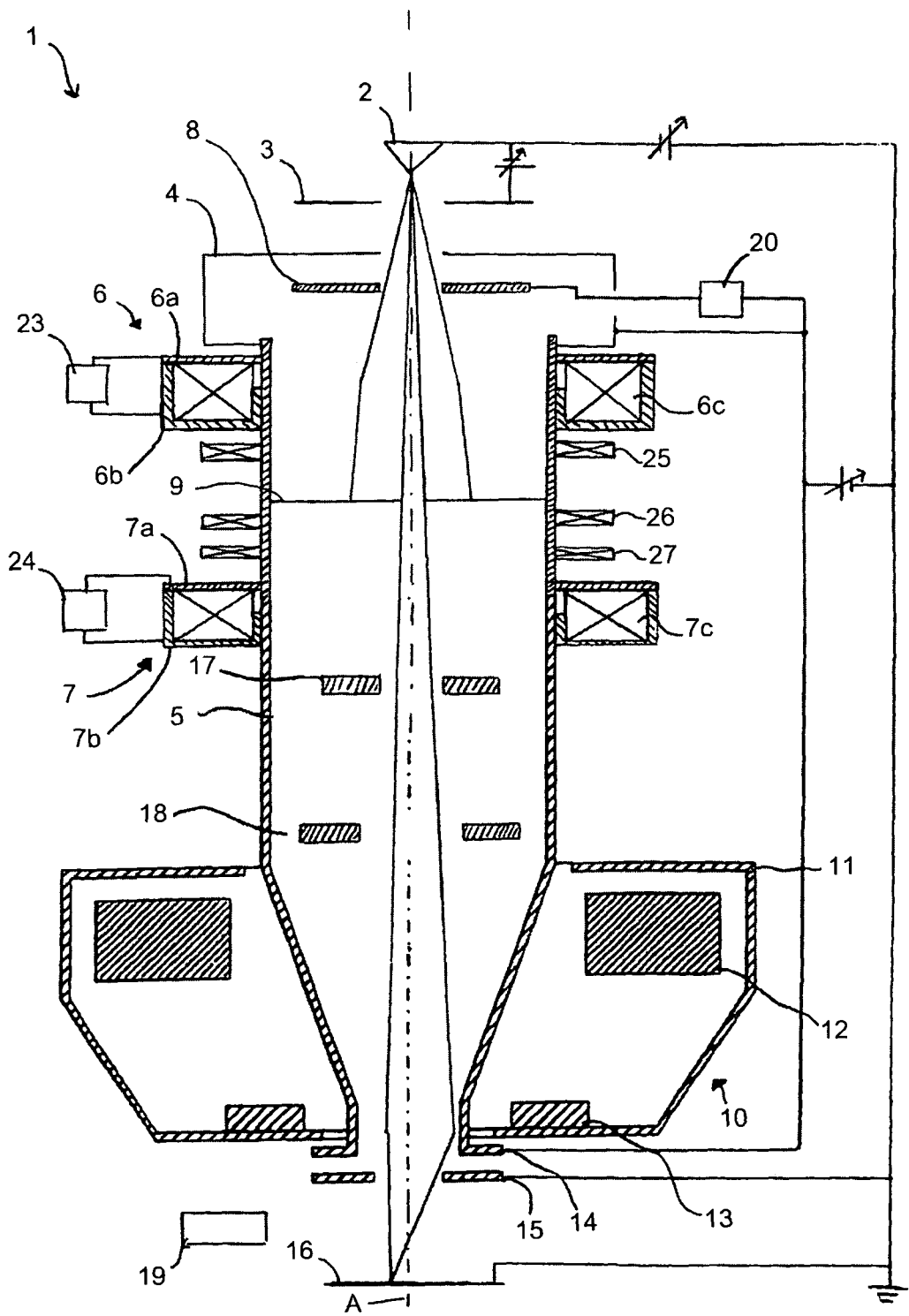
FIG. 9 shows an additional schematic representation of the SEM in FIG. 1 with a crossover-free beam path selected.

FIG. 9 shows SEM 1 from FIG. 1 again with a part of the beam path of the primary electron beam, with a beam current having been selected here that lies between a high current and a low current. This is a transitional area between high-current mode and high-resolution mode. In this exemplary embodiment, first condenser lens 6 and second condenser lens 7 are operated in such a way that a crossover of the primary electron beam does not take place between electron source 2 and objective lens 10. In the crossover-free mode shown in FIG. 9, this mode overlaps somewhat with the high-resolution mode in its upper beam current range (200 pA to 500 pA), for example, when $$0.3\times D<L<0.45\times D \qquad \text{[Formula 4]}$$

applies.
In this overlap, due to the lack of a crossover, the crossover-free mode shows a somewhat better resolution than the high-resolution mode (when comparing the two modi having the same beam current). For a beam current lower than 200 pA, for which $$L<0.3\times D \qquad \text{[Formula 5]}$$

then applies,
only operation in high-resolution mode is possible.

The beam current of the primary electron beam is set as a function of the analysis method to be used. If an image of the surface of sample 16 is to be generated, SEM 1 may be set to its high-resolution mode. For this purpose, a beam current in the range of, for example, 10 pA to 1 nA is selected. If, however, operation in high-current mode is desired in order to apply the analysis methods listed above, a beam current of, for example, a range from 10 nA to some 100's nA is selected.

On SEM 1, second condenser lens 7 has the function to adjust the diameter of the primary electron bundle in objective lens 10 in such a way that good lateral resolution is attained for a selected beam current.

Figure 6:
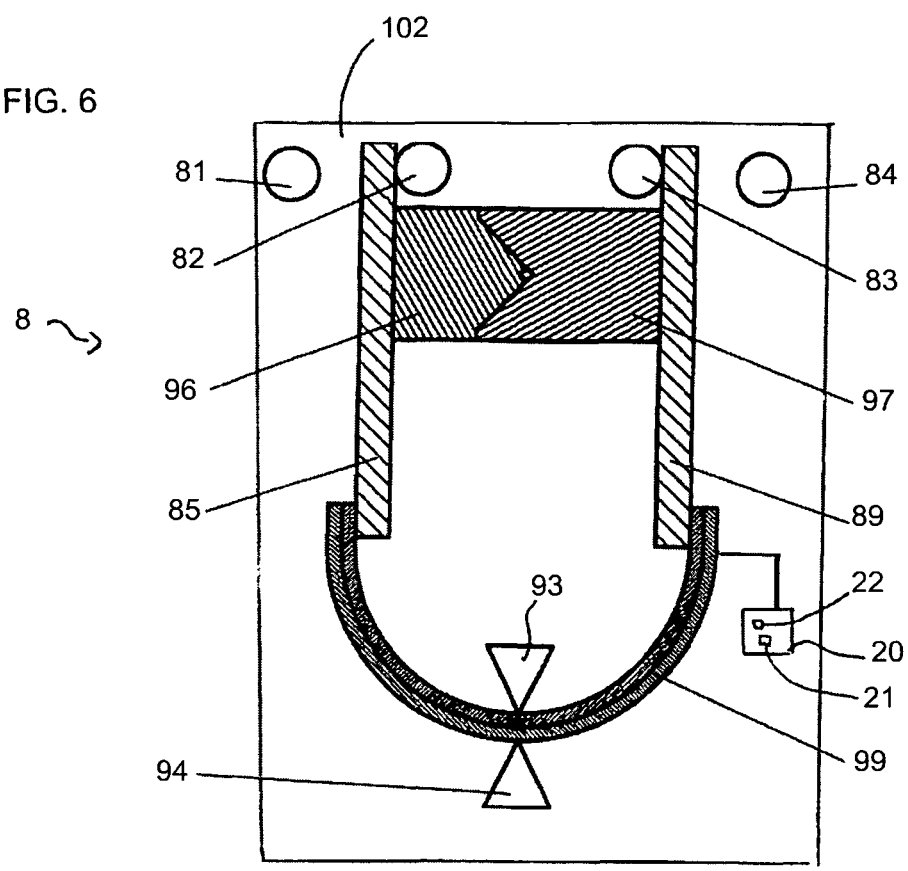
FIG. 6 shows a schematic representation of a second exemplary embodiment of an aperture unit having an adjustable aperture opening.

FIG. 6 shows another exemplary embodiment of first aperture unit 8. Aperture unit 8 is similar to the exemplary embodiment according to FIGS. 2 through 4. Identical components are identified by identical reference numerals. As opposed to the exemplary embodiment according to FIGS. 2 through 4, first aperture element 85 and second aperture element 89 do not have jointed parts. Instead, first aperture element 85 and second aperture element 89 are connected to each other via a bimetal element 99. Bimetal element 99 in turn is connected to a control and supply unit 20. Control and supply unit 20 has an optical sensor 21 and a heating and cooling element 22. When light impinges upon optical sensor 21, heating and cooling element 22 may be switched, in turn controlling bimetal element 99. Depending on the supply of heat and cold, bimetal element 99 may bend, thus moving first aperture element 85 and second aperture element 89 into the positions at the stop elements in order to attain the first opening size or the second opening size of aperture opening 98. Using optical sensor 21 is advantageous because the installation space between electron source 2 and first condenser lens 6 is small and this allows controlling of bimetal element 99 without providing additional space for control input lines. Bimetal element 99 shown in FIG. 6 is elastically designed and provides the same effect and advantage as discussed with regard to the elastic embodiment of first joint 88 and second joint 92. If it is desired that control and supply unit 20 not be situated on base plate 102 in order not to degrade the vacuum in this area, another embodiment provides for bimetal element 99 to be irradiated and heated by injecting a light beam (for example, a laser beam) into SEM 1 in order to thus attain the required flexing for a drive.

Figure 10:
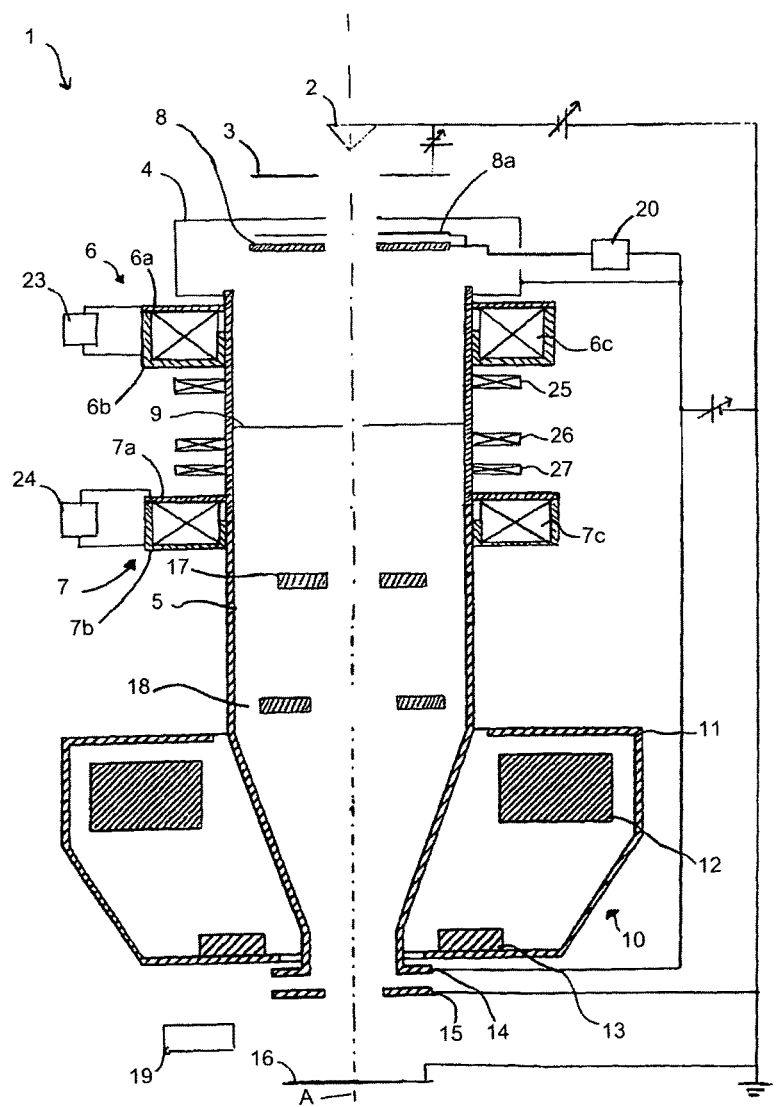
FIG. 10 shows a schematic representation of an SEM with an additional aperture unit whose aperture opening is adjustable according to an embodiment of the system described herein.

FIG. 10 shows another exemplary embodiment of SEM 1. SEM 1 in FIG. 10 corresponds to SEM 1 in FIG. 1. Identical components are identified by identical reference numerals. Contrary to the exemplary embodiment according to FIG. 1, first aperture unit 8 has a circular aperture unit 8a situated between anode 4 and first aperture unit 8. Circular aperture unit 8a provides an aperture opening having a first opening size, while first aperture unit 8 provides an aperture opening having a second opening size and a third opening size. The first opening size is significantly larger than the third opening size. The first opening size is smaller than the second opening size. In this embodiment, first aperture unit 8 corresponds to the embodiment according to FIGS. 2 through 4, in which, on first aperture unit 8, only first aperture stop element 182 is provided for first aperture element 85, and only second aperture stop element 183 is provided for second aperture element 89. These suffice to move first aperture element 85 and second aperture element 89 in such a way that the first opening size (this is the actually attained effective opening) or the third opening size is attained. The above-mentioned embodiment has the advantage that scattered electrons are almost completely prevented in the area of first limiting element 96 and second limiting element 97. Alternatively, the first opening size may also be somewhat larger than or approximately as large as the second opening size. In this embodiment, first stop element 81, second stop element 82, third stop element 83 and fourth stop element 84 will be required instead of first aperture stop element 182 and second aperture stop element 183. By moving first aperture element 85 and second aperture element 89, the second opening size or the third opening size may now be attained. In this embodiment, scattered electrons in the area of first limiting element 96 and second limiting element 97 are—at least mostly—prevented.

Various embodiments discussed herein may be combined with each other in appropriate combinations in connection with the system described herein. Additionally, in some instances, the order of steps described in connection with flow processing of the system described herein may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable storage medium and executed by one or more processors. The computer readable storage medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible storage medium or computer memory on which executable code may be stored and executed by a processor.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A particle beam apparatus, comprising:
   a particle beam generator that generates particles forming a particle beam;
   an objective lens that focuses the particle beam onto a sample;
   a first condenser lens having a first pole shoe situated first and then a second pole shoe as viewed from the particle beam generator toward the objective lens, the first pole shoe and the second pole shoe being adjustable independently of each other, and wherein excitement of the first condenser lens is variable for realizing different beam currents in different operating modes of the particle beam apparatus while independently adjusting the pole shoes;
   a second condenser lens, the first condenser lens being situated first, and then the second condenser lens being situated, as viewed from the particle beam generator toward the objective lens;
   a first aperture unit situated between the particle beam generator and the first condenser lens, wherein the first aperture unit has a first aperture element and a second aperture element, wherein the first aperture element and the second aperture element cooperate to form an aperture opening of adjustable size, wherein the first aperture element and the second aperture element are movable relative to each other, wherein the first aperture unit includes a first aperture stop element and a second aperture stop element, and wherein at least one of the following: (i) the first aperture element is movable so as to contact the first aperture stop element to form the aperture opening, and (ii) the second aperture element is movable so as to contact the second aperture stop element to form the aperture opening; and
   a second aperture unit situated between the first condenser lens and the second condenser lens, wherein the second aperture unit receives a beam modified by adjustment of the pole shoes of the first condenser lens, and wherein the second aperture unit is a pressure stage aperture separating a first area having a first pressure from a second area having a second pressure.

2. The particle beam apparatus as recited in claim 1, wherein the second condenser lens has a third pole shoe and a fourth pole shoe, the third pole shoe being situated first, and then the fourth pole shoe being situated, as viewed from particle beam generator toward the objective lens, and wherein the third pole shoe and the fourth pole shoe are adjustable relative to the second aperture unit together or independently of each other.

3. The particle beam apparatus as recited in claim 2, wherein the third pole shoe and the fourth pole shoe are adjustable independently of each other.

4. The particle beam apparatus as recited in claim 1, further comprising: at least one deflection unit situated between the first aperture unit and the second condenser lens.

5. The particle beam apparatus as recited in claim 1, wherein the first aperture unit includes an aperture opening having an adjustable opening size.

6. The particle beam apparatus as recited in claim 5, wherein the first aperture unit has a first aperture element and a second aperture element, wherein the first aperture element and the second aperture element cooperate to form the aperture opening, and wherein the first aperture element and the second aperture element are movable relative to each other.

7. The particle beam apparatus as recited in claim 6, wherein the first aperture unit includes a first aperture stop element and a second aperture stop element, and wherein, at least one of the following:
   (i) the first aperture element is movable so as to contact the first aperture stop element to form the aperture opening, and
   (ii) the second aperture element is movable so as to contact the second aperture stop element to form the aperture opening.

8. The particle beam apparatus as recited in claim 7, wherein at least one of:
   the first aperture stop element and the second aperture stop element is eccentric.

9. The particle beam apparatus as recited in claim 6, wherein the first aperture unit includes a first stop element and a second stop element, and wherein the first aperture unit is movable so as to contact at least one of: the first stop element to form the aperture opening with a first opening size and the second stop element to form the aperture opening with a second opening size.

10. The particle beam apparatus as recited in claim 9, wherein at least one of:
    the first stop element and the second stop element is eccentric.

11. The particle beam apparatus as recited in claim 6, wherein the first aperture unit includes a third stop element and a fourth stop element, and wherein the second aperture element is movable so as to contact at least one of: the third stop element and the fourth stop element to form the aperture opening.

12. The particle beam apparatus as recited in claim 11, wherein, at least one of:

the third stop element and the fourth stop element is eccentric.

13. The particle beam apparatus as recited in claim 6, wherein the first aperture unit includes at least one drive unit that moves at least one of: the first aperture element and the second aperture element.

14. The particle beam apparatus as recited in claim 13, wherein the drive unit includes at least one of: a piezoelectric element, an electro-magnetic moving member, a bimetal element, a voltage supply unit that supplies voltage to the drive unit, and a heat supply unit that supplies heat to the drive unit or dissipates heat from the drive unit.

15. The particle beam apparatus as recited in claim 13, wherein the drive unit is controlled using an optical signal.

16. The particle beam apparatus as recited in claim 6, wherein the first aperture element and the second aperture element are connected to each other via an elastic connecting element.

17. The particle beam apparatus as recited in claim 16, wherein the elastic connecting element is a bimetal.

18. The particle beam apparatus as recited in claim 6, wherein the first aperture unit includes at least one of the following features:
   (i) the first aperture element is at least partially elastic,
   (ii) the second aperture element is at least partially elastic,
   (iii) the first aperture element includes a first jointed part and a second jointed part connected to each other by a first joint, and
   (iv) the second aperture element includes a third jointed part and a fourth jointed part connected to each other by a second joint.

19. The particle beam apparatus as recited in claim 18, wherein at least one of:
   the first joint and the second joint is elastic.

20. The particle beam apparatus as recited in claim 1, wherein the first aperture unit is at a potential in the range from 1 kV to 20 kV with respect to a ground potential.

21. The particle beam apparatus as recited in claim 1, wherein the second aperture unit is a thin-film aperture.

22. The particle beam apparatus as recited in claim 1, wherein the first pole shoe and the second pole shoe are adjustable in a direction parallel to a side of the second aperture unit facing towards the particle beam generator.

23. A particle beam apparatus, comprising:
   a particle beam generator that generates particles forming a particle beam;
   an objective lens that focuses the particle beam onto a sample;
   a first condenser lens having a first pole shoe situated first, and then a second pole shoe, as viewed from the particle beam generator toward the objective lens, the first pole shoe and the second pole shoe being adjustable independently of each other in order for a path of the primary electron beam to always remain independent of a mode corresponding to a beam energy and current,
   , and wherein excitation of the first condenser lens is variable for realizing different beam currents in different operating modes of the particle beam apparatus while independently adjusting the pole shoes in response thereto;
   a second condenser lens, the first condenser lens being situated first, and then the second condenser lens being situated, as viewed from the particle beam generator toward the objective lens;
   a first aperture unit situated between the particle beam generator and the first condenser lens, wherein the first aperture unit has a first aperture element and a second aperture element, wherein the first aperture element and the second aperture element cooperate to form an aperture opening of adjustable size, wherein the first aperture element and the second aperture element are movable relative to each other, wherein the first aperture unit includes a first aperture stop element and a second aperture stop element, and wherein at least one of the following: (i) the first aperture element is movable so as to contact the first aperture stop element to form the aperture opening, and (ii) the second aperture element is movable so as to contact the second aperture stop element to form the aperture opening; and
   a second aperture unit situated between the first condenser lens and the second condenser lens, wherein the second aperture unit is a pressure stage aperture separating a first area having a first pressure from a second area having a second pressure.

24. The particle beam apparatus as recited in claim 23, wherein the second condenser lens has a third pole shoe and a fourth pole shoe, the third pole shoe being situated first, and then the fourth pole shoe being situated, as viewed from particle beam generator toward the objective lens, and wherein the third pole shoe and the fourth pole shoe are adjustable relative to the second aperture unit independently of each other.

25. The particle beam apparatus as recited in claim 23, wherein the first pole shoe and the second pole shoe are adjustable in a direction parallel to a side of the second aperture unit facing towards the particle beam generator.

26. A particle beam generator that generates particles forming a particle beam;
   an objective lens that focuses the particle beam onto a sample;
   a first condenser lens having a first pole shoe situated first, and then a second pole shoe, as viewed from the particle beam generator toward the objective lens, the first pole shoe and the second pole shoe being adjustable independently of each other;
   a second condenser lens, the first condenser lens being situated first, and then the second condenser lens being situated, as viewed from the particle beam generator toward the objective lens;
   a first aperture unit situated between the particle beam generator and the first condenser lens, wherein the first aperture unit has a first aperture element and a second aperture element, wherein the first aperture element and the second aperture element cooperate to form an aperture opening of adjustable size, wherein the first aperture element and the second aperture element are movable relative to each other, wherein the first aperture unit includes a first aperture stop element and a second aperture stop element, and wherein at least one of the following:
   (i) the first aperture element is movable so as to contact the first aperture stop element to form the aperture opening, and (ii) the second aperture element is movable so as to contact the second aperture stop element to form the aperture opening; and
   a second aperture unit situated between the first condenser lens and the second condenser lens, wherein the second aperture unit is a pressure stage aperture separating a first area having a first pressure from a second area having a second pressure,
   wherein the particle beam apparatus has two operational modes, the two operational modes being a high resolution mode and a high current mode, wherein, by excitement of the first condenser lens, the high resolution mode or the high current mode is set, wherein the first pole shoe and the second pole shoe of the first condenser lens are adjustable independently of each other such that, in the high resolution mode and the high current mode, the particle beam passes through the second aperture unit.

27. The particle beam apparatus as recited in claim 26, wherein the second condenser lens has a third pole shoe and a fourth pole shoe, the third pole shoe being situated first, and then the fourth pole shoe being situated, as viewed from particle beam generator toward the objective lens, and wherein the third pole shoe and the fourth pole shoe are adjustable relative to the second aperture unit independently of each other.

28. The particle beam apparatus as recited in claim 26, wherein the first pole shoe and the second pole shoe are adjustable in a direction parallel to a side of the second aperture unit facing towards the particle beam generator.

29. A method for operating a particle beam apparatus, comprising:
generating particles forming a particle beam using a particle beam generator;
focusing the particle beam onto a sample using an objective lens;
providing a first condenser lens having a first pole shoe situated first, and then a second pole shoe, as viewed from the particle beam generator toward the objective lens, in contact with the first pole shoe, the first pole shoe and the second pole shoe being adjustable independently of each other;
providing a second condenser lens, the first condenser lens being situated first, and then the second condenser lens being situated, as viewed from the particle beam generator toward the objective lens;
providing a first aperture unit situated between the particle beam generator and the first condenser lens, wherein the first aperture unit has a first aperture element and a second aperture element, wherein the first aperture element and the second aperture element cooperate to form an aperture opening of adjustable size, wherein the first aperture element and the second aperture element are movable relative to each other, wherein the first aperture unit includes a first aperture stop element and a second aperture stop element, and wherein at least one of the following: (i) the first aperture element is movable so as to contact the first aperture stop element to form the aperture opening, and (ii) the second aperture element is movable so as to contact the second aperture stop element to form the aperture opening;
providing a second aperture unit situated between the first condenser lens and the second condenser lens, wherein the second aperture unit is a pressure stage aperture separating a first area having a first pressure from a second area having a second pressure; and
adjusting the first pole shoe and the second pole shoe independently of each other wherein the particle beam apparatus has two operational modes, the two operational modes being a high resolution mode and a high current mode, wherein, by excitement of the first condenser lens, the high resolution mode or the high current mode is set, and wherein the first pole shoe and the second pole shoe of the first condenser lens are adjustable independently of each other such that, in the high resolution mode and the high current mode, the particle beam passes through the second aperture unit.

30. The method as recited in claim 29, wherein adjusting the first pole shoe and the second pole shoe independently of each other includes adjusting the first pole shoe and the second pole shoe in a direction parallel to a side of the second aperture unit facing towards the particle beam generator.

* * * * *